(12) United States Patent  
Miwa

(10) Patent No.: US 10,080,305 B2  
(45) Date of Patent: Sep. 18, 2018

(54) INFORMATION PROCESSING DEVICE WITH ELECTRONIC-COMPONENT UNIT PREVENTING ERRONEOUS INSERTION OF ELECTRONIC PARTS

(71) Applicant: NEC Platforms, Ltd., Kawasaki-shi, Kanagawa (JP)

(72) Inventor: Tomoki Miwa, Kawasaki (JP)

(73) Assignee: NEC Platforms, Ltd., Kawasaki-shi, Kanagawa (JP)

( * ) Notice: Subject to any disclaimer, the term of this patent is extended or adjusted under 35 U.S.C. 154(b) by 0 days.

(21) Appl. No.: 15/333,083

(22) Filed: Oct. 24, 2016

(65) Prior Publication Data

US 2017/0118861 A1   Apr. 27, 2017

(30) Foreign Application Priority Data

Oct. 26, 2015   (JP) .................................. 2015-209992

(51) Int. Cl.
| | |
|---|---|
| *H05K 5/00* | (2006.01) |
| *H05K 7/14* | (2006.01) |
| *H05K 5/03* | (2006.01) |
| *H05K 7/20* | (2006.01) |

(52) U.S. Cl.
CPC ............. *H05K 7/1489* (2013.01); *H05K 5/03* (2013.01); *H05K 7/1455* (2013.01); *H05K 7/1487* (2013.01); *H05K 7/20736* (2013.01)

(58) Field of Classification Search
CPC ...... H05K 7/1489; H05K 5/03; H05K 7/1455; H05K 7/1487; H05K 7/20736
USPC ..... 361/756, 679.01, 679.02, 688, 690, 694, 361/695, 748, 752, 758
See application file for complete search history.

(56) References Cited

FOREIGN PATENT DOCUMENTS

| | | |
|---|---|---|
| JP | 62-82987 | 4/1987 |
| JP | 63-50191 | 4/1988 |
| JP | 63-250196 | 10/1988 |
| JP | 4-39995 | 2/1992 |
| JP | 5-182394 | 7/1993 |
| JP | 6-25951 | 4/1994 |
| JP | 9-297984 | 11/1997 |

(Continued)

OTHER PUBLICATIONS

Machine Translation of Japanese Patent Publication No. H05-182394 (Jul. 23, 1993).*

(Continued)

*Primary Examiner* — Tremesha S Willis
(74) *Attorney, Agent, or Firm* — Finnegan, Henderson, Farabow, Garrett & Dunner, L.L.P.

(57) ABSTRACT

An information processing device (e.g. a server) is designed to install a plurality of electronic components (e.g. server modules) connectible to a plurality of connectors arranged in the bottom of a casing. A stopper is attached to the casing at a deviated position slightly deviated from the electronic component in its thickness direction perpendicular to the insertion direction of the electronic component. An interference member is disposed in an interference area asymmetrically located on a first face of the electronic component relative to a second face of the electronic device in its thickness direction with respect to the electronic device. The interference member interferes with the stopper only when the electronic component is inserted into the connectors at an irregular position or in a reverse manner.

5 Claims, 10 Drawing Sheets

(56) References Cited

FOREIGN PATENT DOCUMENTS

| | | |
|---|---|---|
| JP | 10-241240 | 9/1998 |
| JP | 2010-153695 | 7/2010 |
| JP | 2013-242859 | 12/2013 |
| JP | 2014-41701 | 3/2014 |
| JP | 2015-49963 | 3/2015 |

OTHER PUBLICATIONS

Notice of Allowance issued by the Japanese Patent Office in counterpart Japanese Patent Application No. 2015-209992, dated May 30, 2017.

Japanese Office Action dated Sep. 20, 2016, by the Japanese Patent Office in counterpart Japanese Patent Application No. 2015-209992.

\* cited by examiner

FIG. 4
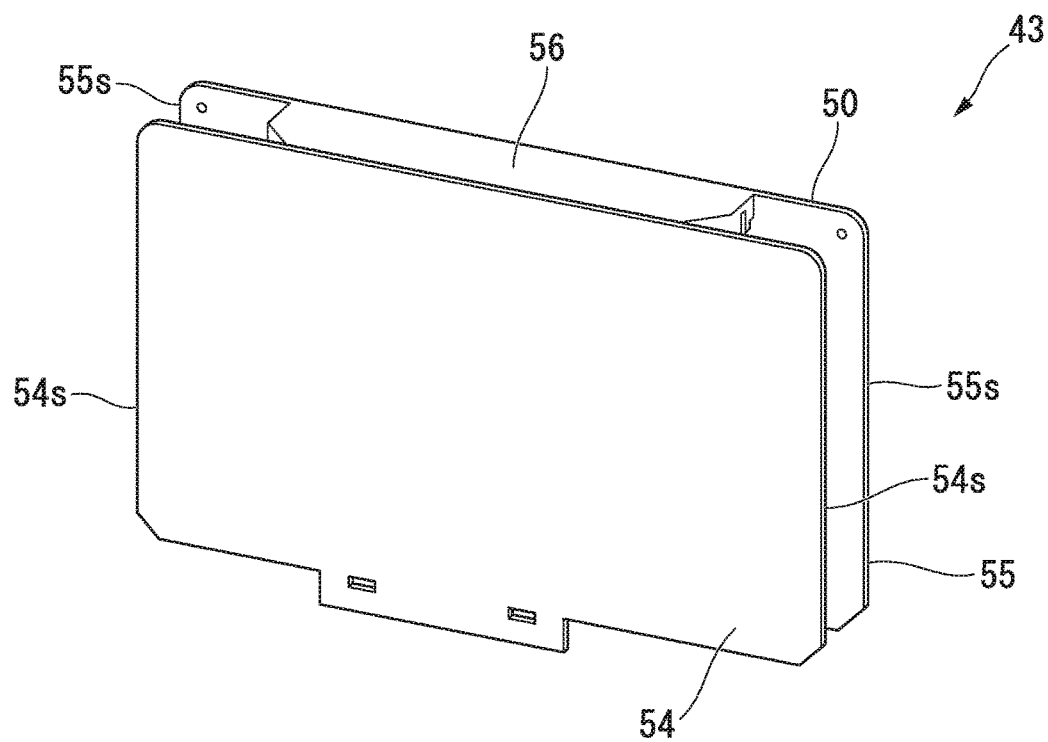
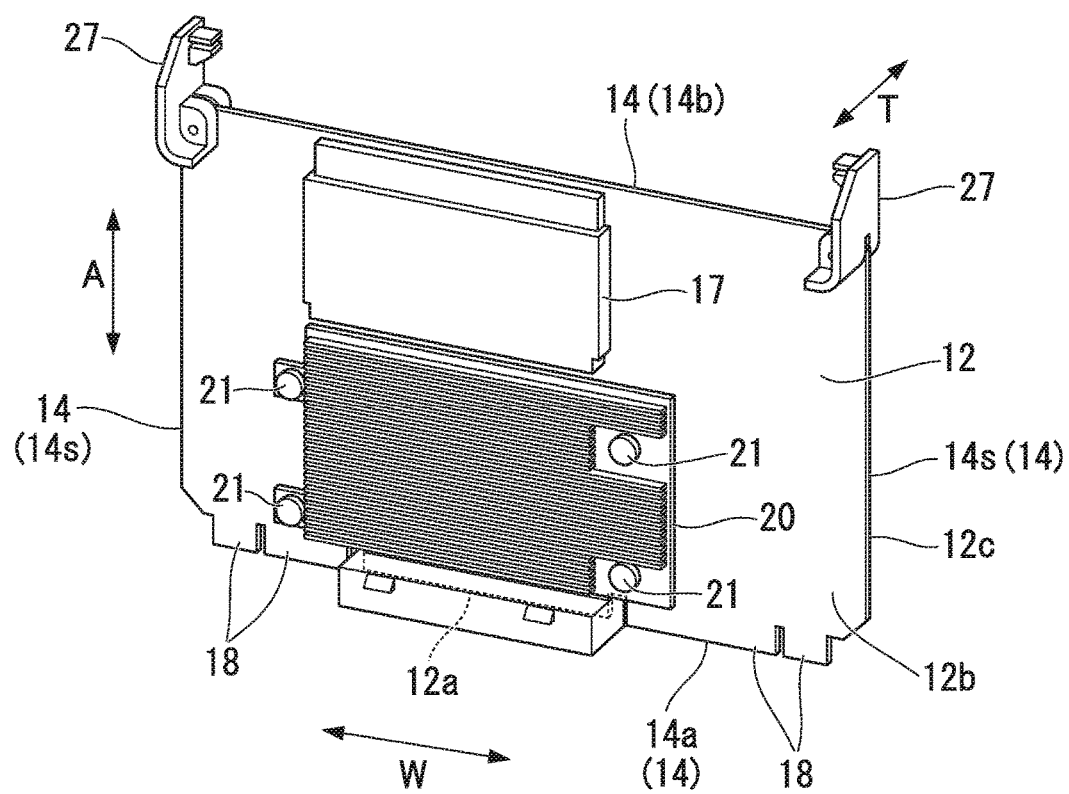

INFORMATION PROCESSING DEVICE WITH ELECTRONIC-COMPONENT UNIT PREVENTING ERRONEOUS INSERTION OF ELECTRONIC PARTS

CROSS-REFERENCE TO RELATED APPLICATION

The present application claims the priority benefit of Japanese Patent Application No. 2015-209992 filed on Oct. 26, 2015, the subject matter of which is hereby incorporated herein by reference.

BACKGROUND OF THE INVENTION

1. Field of the Invention

The present invention generally relates to an information processing device, in particular, to an electronic-component unit configured to prevent erroneous insertion of electronic parts.

2. Description of Related Art

It is well known that information processing devices such as servers are designed to install multiple electronic components such as modules in casings, wherein electronic components are connected to connectors arranged in casings; hence, connecting parts connectible to connectors are formed in peripheral portions of substrates mounting electronic parts thereon. To install electronic components in casings, it is necessary that connecting parts of electronic devices be connected to connectors of casings at precise positions and precise orientations.

Patent Document 1 (i.e. Japanese Patent Application Publication No. 2015-49963) discloses a connecting structure for electronic parts and terminal fittings with preventing erroneous insertion of electronic parts. Patent Document 2 (i.e. Japanese Patent Application Publication No. 2014-41701) discloses a card connecting structure of an electronic device using a card connector with an erroneous insertion prevention member. Patent Document 3 (i.e. Japanese Patent Application Publication No. 2013-242859) discloses a server module having a reversible shape with a riser-card unit. Patent Document 4 (i.e. Japanese Patent Application Publication No. 2010-153695) discloses an information processing device having a motherboard with precisely positioning in XY-axis directions and bendability in a Z-axis direction. Patent Document 5 (i.e. Japanese Utility-Model Application Publication No. H06-25951) discloses an erroneous insertion prevention structure of an IC card being inserted into a slot formed in the casing of an electronic device.

In Patent Document 2, an erroneous insertion prevention member is formed in the back of a card insertion part while a cutout is formed at one distal end of a card member in its insertion direction so as to prevent interference with the erroneous insertion prevention member. Herein, the cutout of the card member prevents interference with the erroneous insertion prevention member when the card member is inserted into the card insertion part at a regular position, thus it is possible to reliably insert the card member at the regular position. Additionally, it is possible to stop further inserting the card member whose edge is brought into contact with the erroneous insertion prevention member when the card member is forcedly inserted into the card insertion part at an irregular position. However, this technology suffers from the following problem. That is, it is necessary to prepare an adequate space for installing an erroneous insertion prevention member being projected from the bottom of a casing corresponding in the insertion direction of the card member. This may degrade the layout of connectors arranged in the bottom of a casing since the space of arranging connectors is limited by the erroneous insertion prevention member.

The prevent invention aims to solve the above problem concerning the limited space for the layout of connectors in the bottom of a casing by providing an information processing device with an electronic-component unit which is designed to prevent erroneous insertion of electronic components while improving the freedom of designing the layout of connectors in the bottom of a casing.

SUMMARY OF THE INVENTION

In a first aspect of the invention, an information processing device includes a casing, a stopper, and an interference member. The casing is equipped with connectors insertable with an electronic component in an insertion direction. The stopper is attached to the casing at a deviated position slightly deviated from the electronic component in its thickness direction perpendicular to the insertion direction of the electronic component. The interference member is disposed in an interference area asymmetrically located on a first face of the electronic component relative to a second face of the electronic device in its thickness direction with respect to the electronic device. The interference member interferes with the stopper only when the electronic component is inserted into connectors at an irregular position or in a reverse manner. Additionally, the interference member is disposed close to at least one end of the electronic device in its width direction perpendicular to the insertion direction and the thickness direction of the electronic component. Correspondingly, the stopper is attached to the casing at the deviated position which is opposite to at least one end of the electronic component.

In a second aspect of the invention, an electronic-component unit includes a substrate and a duct cover. The substrate has a first face and a second face in its thickness direction. The duct cover includes a first plate configured to cover the first face of substrate and a second plate configured to cover the second face of the substrate. The substrate is interposed between the first plate and the second plate such that the substrate is disposed with an offset closer to either the first plate or the second plate rather than the center position between the first plate and the second plate.

In a third aspect of the invention, a casing includes connectors and a stopper. Herein, connectors are insertable with an electronic component in an insertion direction. The stopper is disposed at a deviated position slightly deviated from the electronic component in its thickness direction perpendicular to the insertion direction of the electronic component. The stopper interferes with a predetermined part of the electronic component so as to prevent the electronic component from being inserted into connectors only when the electronic component is inserted into connectors at an irregular position or in a reverse manner. Additionally, the stopper is disposed at the deviated position which is opposite to at least one end of the electronic component in its width direction perpendicular to the insertion direction and the thickness direction of the electronic component.

According to the present invention, it is possible to improve the freedom of designing the layout of connectors in the bottom of the casing while reliably preventing erroneous insertion of electronic parts into the casing.

BRIEF DESCRIPTION OF THE DRAWINGS

FIG. 4 is an exploded perspective view of the sever module shown in FIG. 3.

DETAILED DESCRIPTION OF THE EMBODIMENTS

The present invention will be described in detail by way of examples with reference to the accompanying drawings in which parts identical to those shown in various drawings will be denoted using the same reference signs.

1. Information Processing Device

Figure 1:
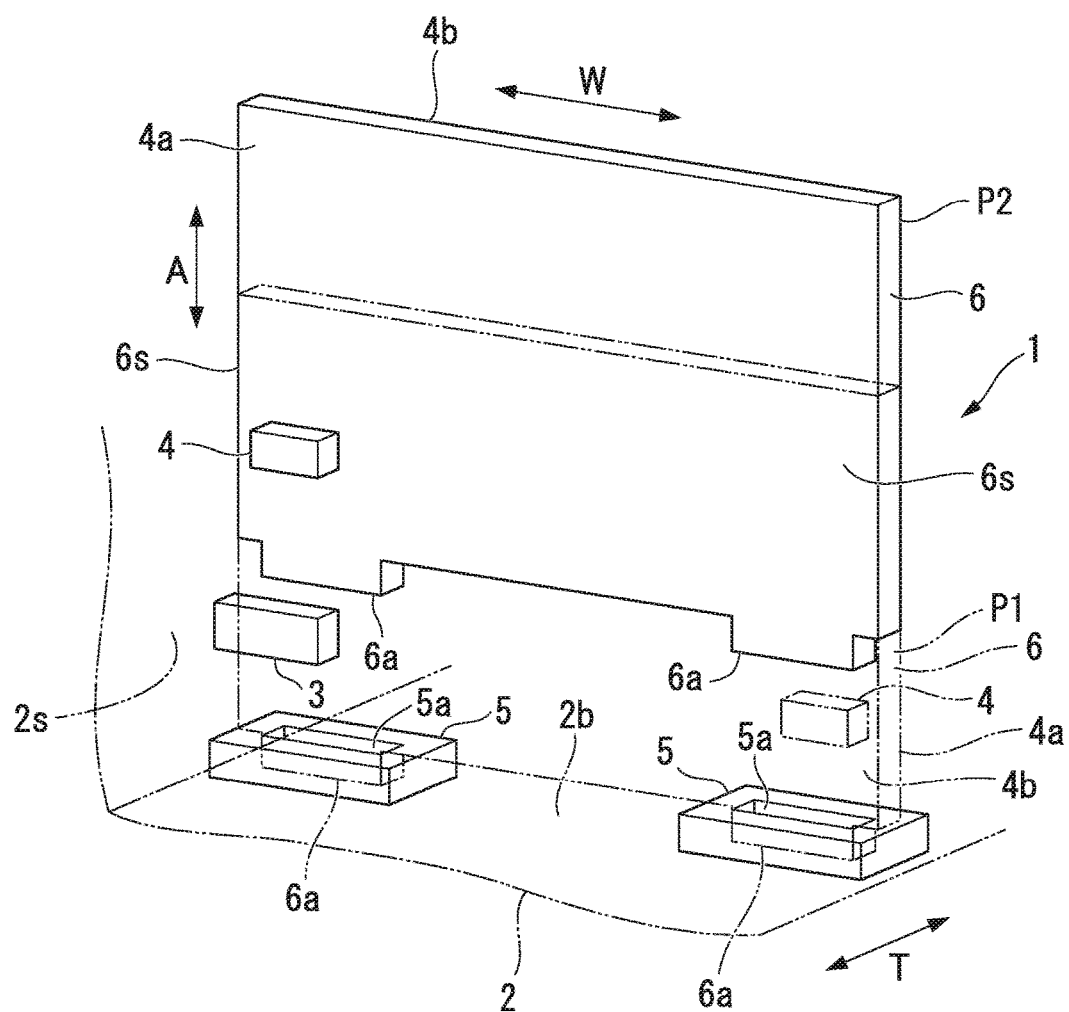
FIG. 1 is a perspective view showing the minimum configuration of an information processing device according to one embodiment of the present invention.

FIG. 1 is a perspective view showing the minimum configuration of an information processing device according to one embodiment of the present invention. An information processing device 1 includes at least a casing 2, a stopper 3, and an interference member 4. The casing 2 is equipped with connectors 5 connectible to electronic components 6. For example, the electronic component 6 includes insertion protrusions 6a which are formed and protruded externally of the external periphery thereof. Correspondingly, the connectors 5 include insertion recesses 5a insertable with the insertion protrusions 6a. Herein, the electronic component 6 is moved in an insertion direction A and engaged with the casing 2 such that the insertion protrusions 6a are inserted into the insertion recesses 5a of the connectors 5.

The interference member 4 is formed at the predetermined position such that the interference member 4 interferes with the stopper 3 only when the electronic component 6 is mistakenly moved in a wrong direction or to a wrong position against the connectors 5. The interference member 4 is disposed in at least one of side faces 6s in a width direction W of the electronic component 6 perpendicular to a thickness direction T and the insertion direction A. Specifically, a pair of interference members 4 are arranged in an asymmetrical manner with sandwiching the electronic component 6 along with a pair of sides 4a, 4b which are opposite to each other in the thickness direction T. That is, one interference member 4 is arranged on one side 4a at one position (e.g. a left-side position in FIG. 1) while another interference member 4 is arranged on another side 4b at another position (e.g. a right-side position in FIG. 1) opposite to one position in the width direction W.

The stopper 3 is arranged in the casing 2 at the predetermined position separated from the electronic component 6 in the thickness direction T of the electronic component 6 perpendicular to the insertion direction A in which the insertion projections 6a of the electronic component 6 are inserted into the insertion recesses 5a of the connectors 5. The stopper 3 is arranged in an area 2s opposite to the side face 6s arranging the interference member 4 in the electronic component 6. The information processing device 1 is designed such that a pair of interference members 4 are disposed asymmetrically in a pair of sides 4a, 4b (which are opposite to each other in the thickness direction T) sandwiching the electronic component 6. This makes it possible to prevent the interference member 4 from interfering with the stopper 3 since the interference member 4 is positioned in the opposite side, opposite to the stopper 3, with respect to the electronic component 6 when the electronic component 6 is moved in a regular direction along dashed lines P1 so that the insertion protrusions 6a will be inserted into the insertion recesses 5a of the connectors 5. Thus, it is possible to reliably connect the electronic component 6 to the connectors 5.

When the electronic component 6 is moved in an irregular direction along with solid lines P2, the interference member 4 is positioned in the same side as the stopper 3. Thus, it is possible to prevent the electronic component 6 from being connected to the connectors 5 in an irregular direction due to an interference between the interference member 4 and the stopper 3.

In the above structure, the stopper 3 and the interference member(s) 4 are positioned close to the side faces 6s in the width direction W of the electronic component 6; hence, they do not obstruct the layout of the connectors 5 arranged in a bottom 2b of the casing 2. Thus, it is possible to improve the freedom of designing the layout of multipolar connectors (e.g. the connectors 5) while reliably limiting erroneous insertion of the electronic component 6.

2. Server

Figure 2:
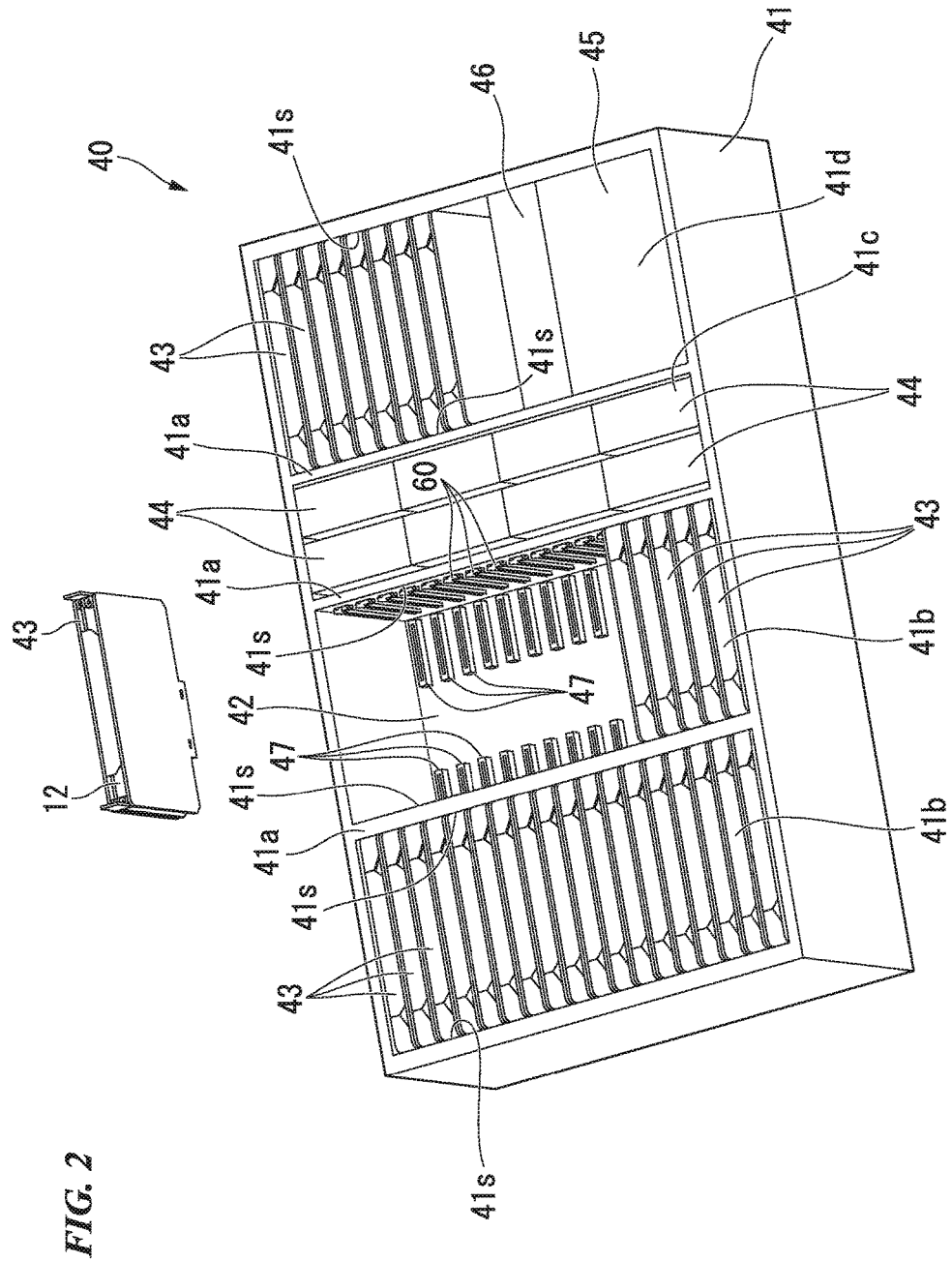
FIG. 2 is a perspective view showing an example of a server accommodating a plurality of server modules corresponding to electronic-component units according to another embodiment of the present invention.

FIG. 2 is a perspective view showing another information processing device according to another embodiment of the present invention, i.e. a server 40 accommodating a plurality of server modules 43.

The server 40 includes a chassis 41 (i.e. an enclosure or a casing), a baseboard 42, a plurality of server modules 43 (i.e. electronic-component units), a plurality of fan modules 44, a power unit 45, and a communication unit 46.

The chassis 41 accommodates at least the baseboard 42, the server modules 43, the fan modules 44, the power unit 45, and the communication unit 46. The chassis 41 is formed in a rectangular box shape with an upper opening in a plan view. For example, the chassis 41 is supported by a rack such that it can be slidably moved in front-rear directions. An operator (or an electrician or mechanic handing a maintenance operation) can access the inside of the chassis 41 which is forwardly drawn out of a rack. Additionally, an operator can push the chassis 41, which is temporarily drawn out of a rack, backwardly into a rack.

According to the present embodiment, the chassis 41 of the server 40 has an elongated shape in its longitudinal direction (or its front-rear direction), wherein the power unit 45 is installed in the rear side. The chassis 41 is equipped with partition members 41a configured to partition the internal space thereof in the front-rear direction. A plurality of through-holes are formed in the partition members 41a so as to transmit cooling air flowing in the front-rear direction. The chassis 41 are partitioned by the partition members 41a into server-module storage blocks 41b, a fan-module storage block 41c, and a reserve storage block 41d in the front-rear direction.

A pair of server-module storage blocks 41b are arranged to adjoin together in the front-rear direction. The server-module storage blocks 41b accommodate a plurality of server modules 43. Numerous server modules 43 can be stored in the server-module storage blocks 41b at the pre-determined positioning such that the thickness direction of each server module 43 matches the width direction of the chassis 41. In other words, two server-module storage blocks 41b are able to store numerous server modules 43 which adjoin together in their thickness direction.

The fan-module storage block 41c is interposed between the server-module storage block 41b and the reserve storage block 41d. The fan-module storage block 41c stores multiple fan modules 44. The fan modules 44 are stored in the fan-module storage block 41c to adjoin together in the width direction of the chassis 41 with their rotation axes aligned along the front-rear direction. In the fan-module storage blocks 41c, multiple pairs of fan modules 44 are aligned in two rows in the front-rear direction. The fan modules 44 cause cooling air to flow in the front-rear direction.

The reserve storage block 41d stores multiple server modules 43, the power unit 45, and the communication unit 46. Specifically, the reserve storage block 41d can store the server modules 43 in the remaining space after storing the power unit 45 and the communication unit 46 therein. The power unit 45 and the communication unit 46 have cables, connectible to other devices arranged externally of the server 40, which can be drawn out of the rear face of the chassis 41.

The baseboard 42 is fixed onto the bottom of the chassis 41. The baseboard 42 is formed in a sheet-like shape covering the server-module storage blocks 41b, the fan-module storage block 41c, and the reserve storage block 41d. In this connection, the baseboard 42 includes wires, connectors 47, and other connectors.

The connectors 47 are arranged inside the server-module storage blocks 41b and the reserve storage block 41d. In the server-module storage blocks 41b, the connectors 47 are each divided into front and rear parts which separate from each other in the front-rear direction of the chassis 41 while the connectors 47 are aligned in the width direction of the chassis 41 with predetermined intervals slightly larger than the thickness of each server module 43. Similarly, the connectors 47 are aligned in the remaining area of the reserve storage block 41d used to store the server modules 43. In the remaining area of the reserve storage block 41d similar to the server-module storage blocks 41b, the connectors 47 are each divided into front and rear parts which separate from each other in the front-rear direction of the chassis 41 while the connectors 47 are aligned in the width direction of the chassis 41 with predetermined intervals slightly larger than the thickness of each server module 43.

As show in FIG. 4, the server module 43 includes a substrate (accommodating electronic parts) nic parts) 12 having connecting parts 18. The connectors 47 are shaped and positioned in connection with the connecting parts 18 of the server module 43 such that the connecting parts 18 can be detachably connected to the connectors 47. Specifically, the connectors 47 have a plurality of electrodes electrically connectible to a plurality of electrodes disposed in the connecting parts 18 when the connectors 47 are connected to the server modules 43 with their connecting parts 18.

FIG. 2 does not show the details of the baseboard 42 equipped with a plurality of connectors electrically connectible to the fan modules 44 in the fan-module storage block 41c. Electric power is applied to the fan modules 44 to drive fans via those connectors.

Figure 3:
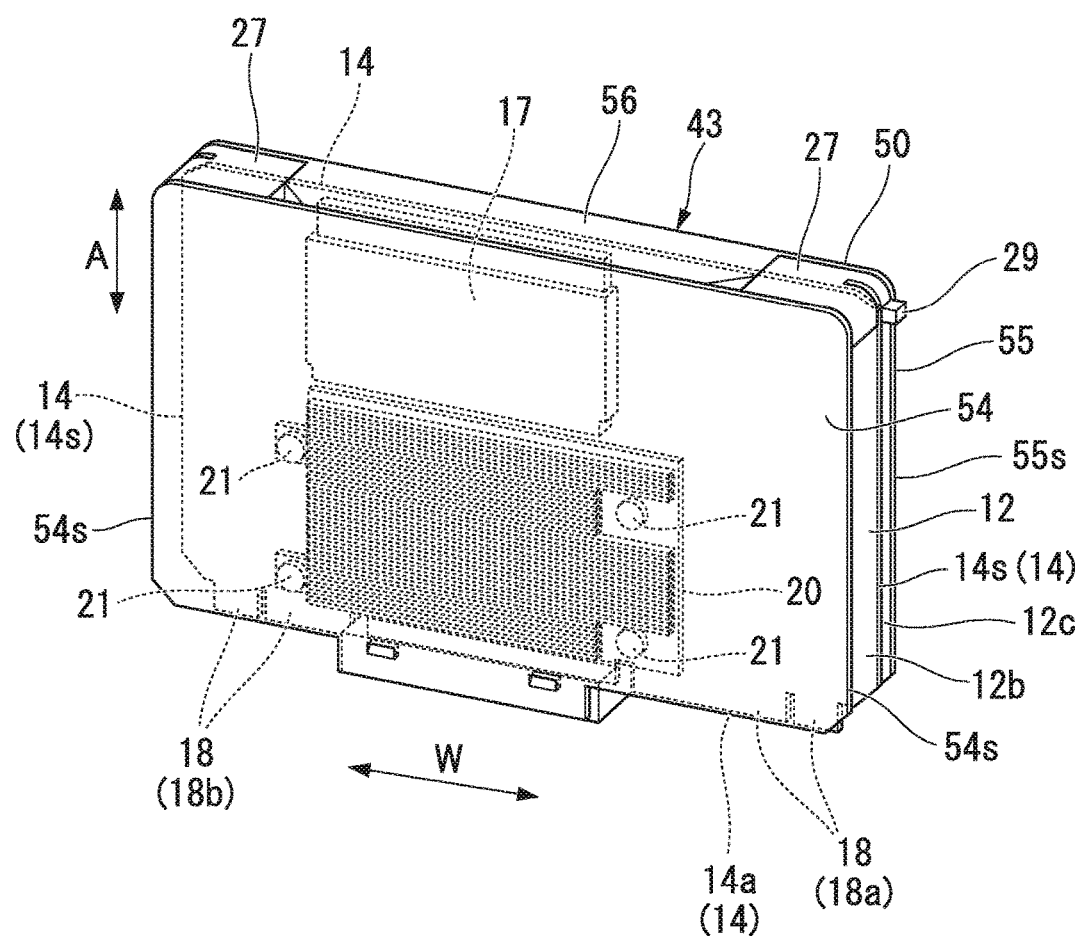
FIG. 3 is a perspective view of a server module installed in the server shown in FIG. 2.

FIG. 3 is a perspective view of the server module 43, and FIG. 4 is a exploded perspective view of the server module 43. As shown in FIGS. 3 and 4, the server module 43 is a module having a server function including a CPU and a heat sink 20 configured to cool heat generated by a CPU. The server module 43 includes the substrate 12 and a duct cover (or a duct member) 50.

The substrate 12 is a multilayered substrate such as a printed circuit board (PCB) having wirings, wherein a semiconductor part such as a CPU, a storage unit such as a hard-disk drive (HDD), and other parts such as memory slots are mounted on at least one of front and back faces of the substrate 12. The present embodiment refers to the substrate 12 mounting a CPU and a memory slot 17.

The substrate 12 is formed in a rectangular plate shape with four linear sides 14 in a peripheral portion 12a. The substrate 12 has the connecting part 18 along a front side 14a among four sides 14. Specifically, the connecting part 18 includes a pair of connecting parts 18a, 18b which are separated from each other along the front side 14a. The connecting parts 18a, 18b further include a plurality of electrodes (not show) aligned along the front side 14a. The connecting parts 18a, 18b can be detachably connected to the connectors 47. Herein, the substrate 12 is moved in an insertion direction A corresponding to the lateral sides 14s adjoining the front side 14a so that the connecting parts 18a, 18b can be connected to the connectors 47.

The substrate 12 is equipped with the heat sink 20 used to cool heat generated by a CPU. The heat sink 20 is fixed to the substrate 21 by means of fastening members 21 (e.g. small screws or vises).

The substrate 12 is equipped with latches 27 which are attached to the peripheral portion 12a along a rear side 14b opposite to the front side 14a among four sides 14. The latches 27 having rotation axes laid in the thickness direction T of the substrate 12 can be pivotally rotated about rotation axes in a range between an installing position (see FIG. 3 showing the latches 27 being installed along the rear side 14b) and a holding position (see FIG. 4 showing the latches 27 being uprightly held on the rear side 14b). Two latches 27 are separated from each other and disposed at two corners along the rear side 14b of the substrate 12. This makes it possible for an operator (e.g. a mechanic or electrician conducting a maintenance operation) to hold the latches 27 with his/her right and left hands, thus allowing an operator to easily insert or extract the server module 43 to carry the server module 43 for the purpose of a maintenance operation or the like.

The latch 27 has a projection 29 which is displaced as the latch 27 pivotally rotates about its rotation axis. Owing to the formation of the projection 29, it is possible for an operator to hook the projection 29 with an engagement recess 41m (see FIG. 7) after pivotally rotating the latches 27 from the holding position to the installing position, thus causing a leverage effect which may allow an operator to push the server module 43 into the server 40 so as to connect the connecting parts 18 to the connectors 47.

The duct cover 50 is designed to cover the substrate 12. For example, the duct cover 50 serves as a duct conducting cooling air forcedly flown by the fan module(s) 44. Herein, cooling air is forced to flow in the longitudinal direction of the chassis 41 along the front side 14a of the substrate 12. For this reason, the duct cover 50 has a pair of openings formed in proximity to the opposite ends of the front side 14a of the substrate 12. The duct cover 50 includes a first plate (or a front cover plate) 54, a second plate (or a rear cover plate) 55, and a third plate 56.

The first and second plates 54 and 55 are formed in symmetrical shapes. The first and second plates 54 and 55 are designed to cover a front face (or a first face) 12b and a rear face (or a second face) 12c of the substrate 12 except for the connecting parts 18. The first and second plates 54 and 55 are formed like parallel plates disposed in parallel to the substrate 12. Additionally, the first plate 54 has a pair of lateral sides 54s while the second plate 55 has a pair of lateral sides 55s, wherein those parts 54s and 55s are positioned oppositely in a width direction W of the substrate 43. In this connection, the lateral sides 54s and 55s of the first and second plates 54 and 55 are disposed at the same positions as the lateral sides 14s of the substrate 12 in the width direction W of the server module 43.

The third plate 56 connects between the first plate 54 and the second plate 55. Specifically, the third plate 56 is formed like a flat plate connecting between the first plate 54 and the second plate 55 along the rear side 14b of the substrate 12. The third plate 56 is shaped to circumvent the latches 27 attached to the rear side 14b of the substrate 12.

The first plate 54 is separated from the second plate 55 with respect to the substrate 12. In other words, the substrate 12 is disposed at an offset position, which is deviated from the center position between the first and second plates 54 and 55 (which are positioned opposite to each other) and closer to the second plate 55 rather than the first plate 54.

Figure 5:
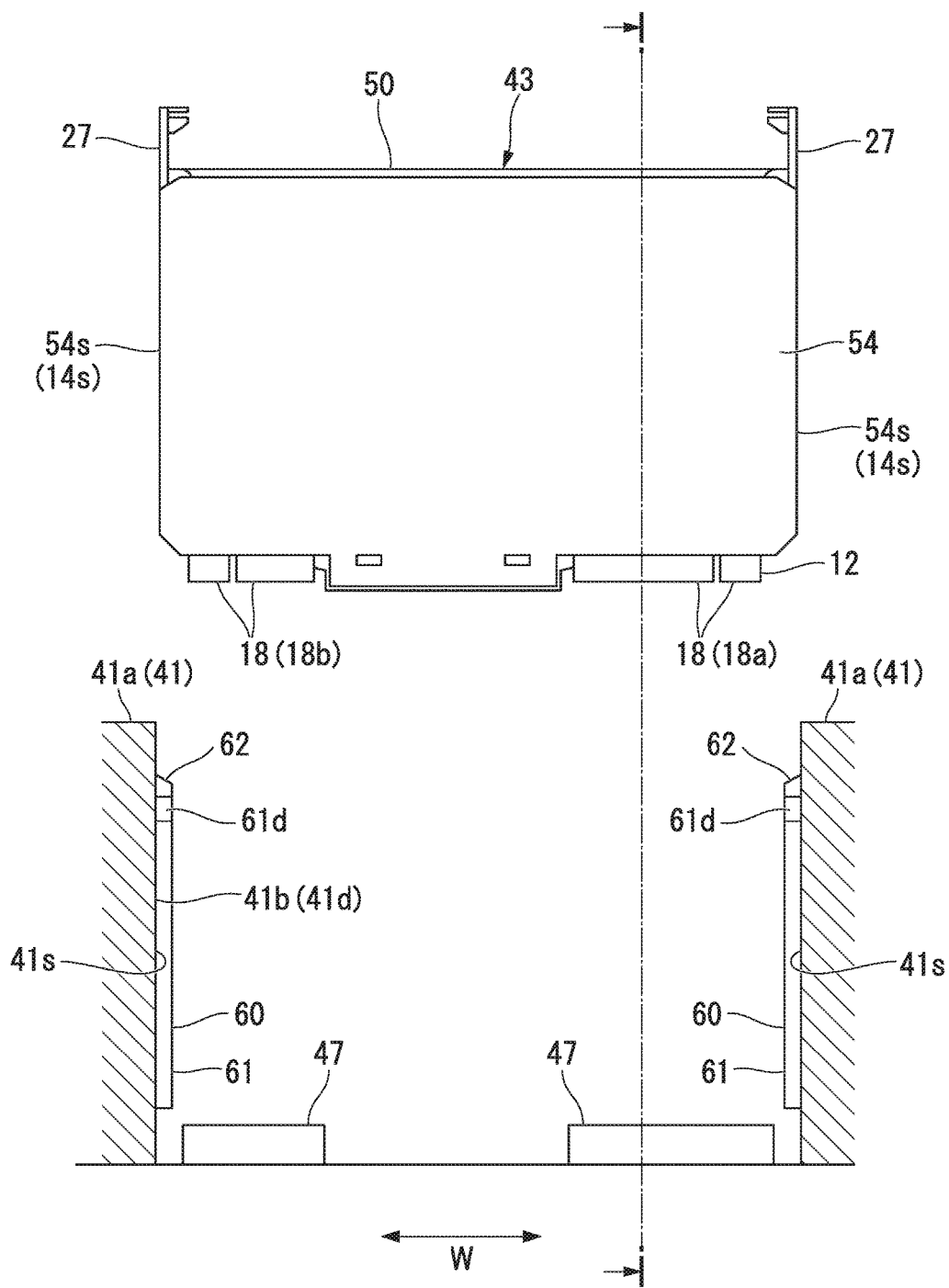
FIG. 5 is a cross-sectional view showing the server module being installed in a server-module storage block partitioned in a chassis of a server.
Figure 6:
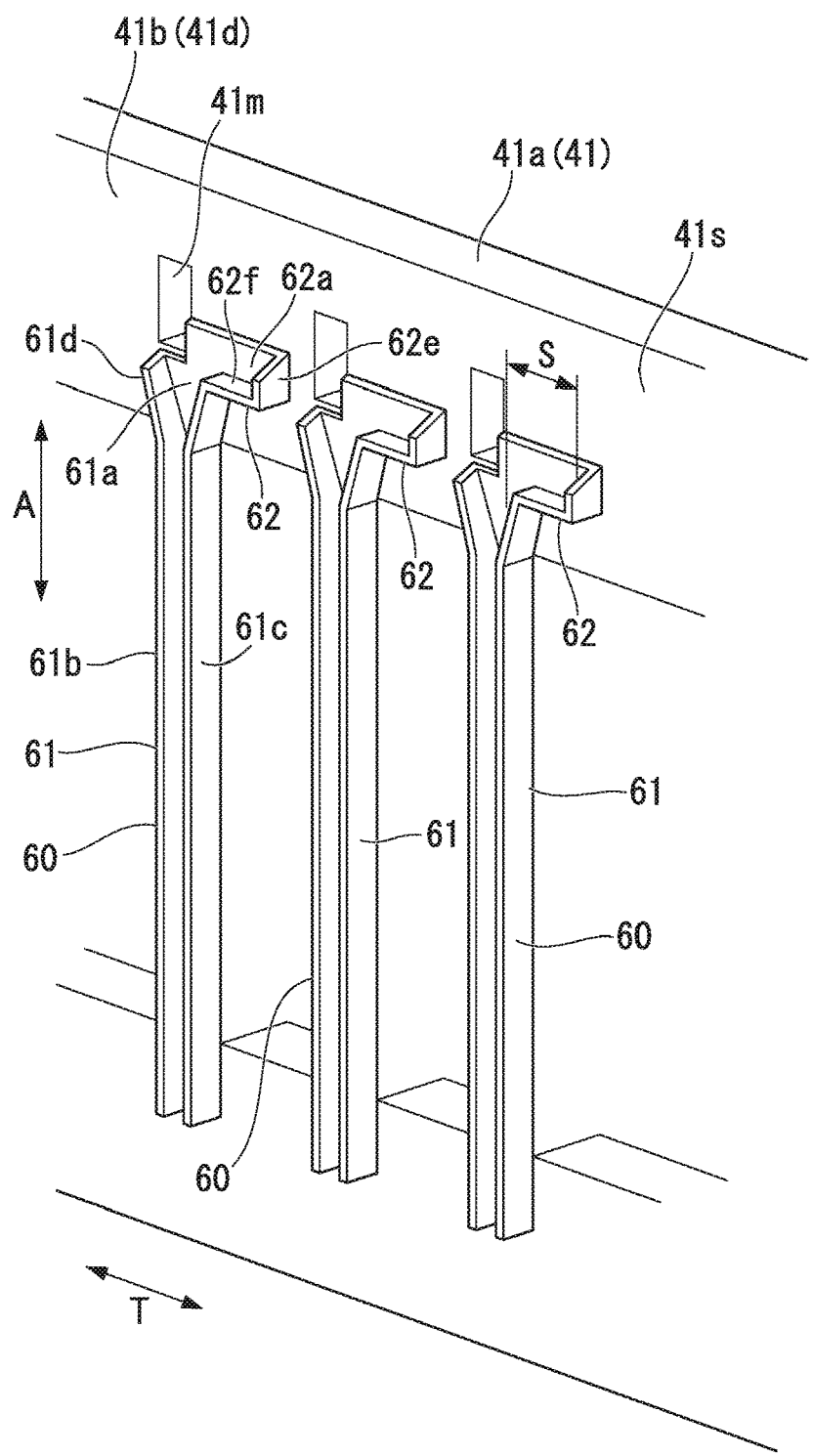
FIG. 6 is a perspective view showing a plurality of guide members laid on the interior face of a server-module storage block of a chassis of a server.
Figure 7:
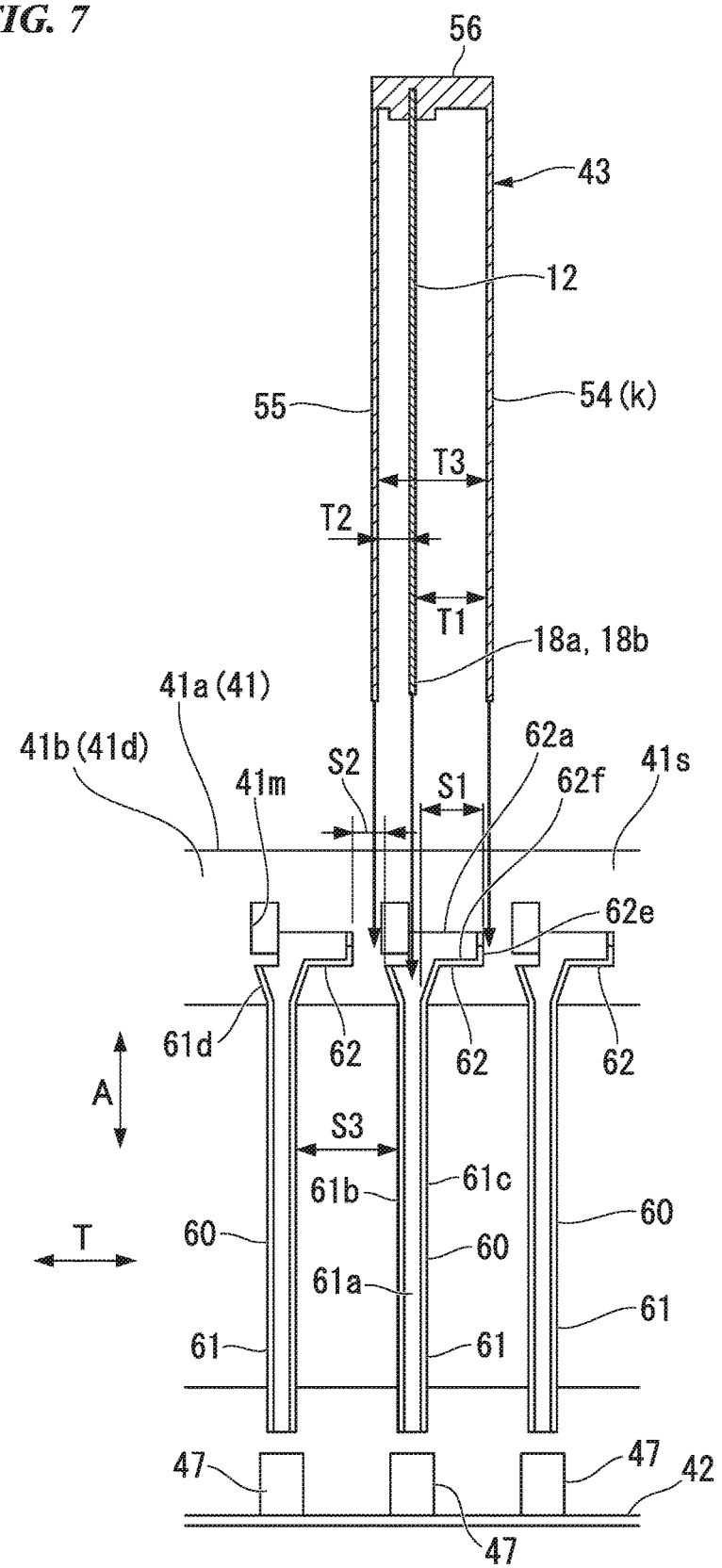
FIG. 7 is a cross-sectional view showing the server module being guided by the guide member in a server-module storage block of a chassis of a server.

FIG. 5 is a cross-sectional view showing the server module 43 being installed in the server-module storage block 41b of the chassis 41. FIG. 6 is a perspective view showing a plurality of guide members laid on the interior face of the server-module storage block 41b. FIG. 7 is a cross-sectional view showing the server module 43 being guided by the guide member in the server-module storage block 41b of the chassis 41.

The server-module storage blocks 41b and the remaining area of the reserve storage block 41d are partitioned using the partition members 41a with internal faces (or internal areas) 41s which are positioned opposite to each other in the front-rear direction. As shown in FIG. 5, a plurality of guide members (i.e. guide rails) 60 are attached to the interior faces of the partition members 41a so as to guide the server modules 43 being inserted into the storage blocks 41b, 41d in the installation direction A. Herein, a pair of guide rails 60 are attached to the interior faces 41s of the partition members 41a (which are positioned opposite to each other in the front-rear direction of the chassis 41) and positioned opposite to each other in the width direction W of the server module 43 such that they are positioned to face the lateral faces 14s of the substrate 12. As shown in FIGS. 6 and 7, a plurality of guide rails 60 are arranged in correspondence with a plurality of server modules 43 in the storage blocks 41b, 41d and positioned with predetermined intervals along the width direction of the chassis 41 (corresponding to the thickness direction T of the server module 43).

The guide rail 60 includes a guide 61 and a stopper 62 which are integrally formed together. The guide 61 includes a base 61a and a pair of side walls 61b, 61c which are integrally formed together. The base 61a is fixed to the interior face 41s of the partition member 41a and extended in the insertion direction A. A pair of side walls 61b, 61c are formed at opposite ends of the base 61a. The side walls 61b, 61c are built up perpendicularly to the interior face 41s of the partition member 41a and continuously extended in the insertion direction A. A pair of guides 61 (which are positioned opposite to each other in the width direction W of the substrate 12) are designed to guide the substrate 12 in the insertion direction A while holding the lateral sides 14s of the substrate 12 between the side walls 61b, 61c. As shown in FIGS. 6 and 7, a taper portion 61d which is formed to gradually increase the spacing between the side walls 61b and 61c in an upward direction is formed at the upper end of the guide 61.

The stopper 62 includes a base 62a, a stopper face 62f, and a terminal wall 62e, which are integrally formed together. The based 62a is formed on the interior face 41s of the partition member 41a. The stopper face 62f is extended from the upper end of the side wall 61c of the guide 61 in a direction perpendicular to the insertion direction A such that the distal end of the stopper face 62a will be distanced from the side wall 61b. The terminal wall 62e is formed in connection with the distal end of the stopper face 62f at the farthermost position from the side wall 61b. Thus, the stopper 62 is formed closer to the substrate 12 rather than the guide rail 60 in the insertion direction.

The stopper 62 (which is attached to the interior wall 41s of the partition member 41a in the chassis 41) is slightly deviated from the guide 61 of the guide rail 60 (which is designed to guide the substrate 12) in the thickness direction T perpendicular to the insertion direction A. In other words, the stopper 62 is disposed at an offset position which is biased in one side in the thickness direction T, i.e. the stopper 62 is slightly deviated from the side wall 61c of the guide 61 of the guide rail 60 in the thickness direction T. Additionally, the stopper 62 is interposed between two guide rails 60, which are positioned adjacent to each other in the thickness direction T, among a plurality of guide rails 60 which are aligned with predetermined intervals in the width direction of the chassis 41 corresponding to the thickness direction T of the substrate 12.

As shown in FIG. 7, a distance S1 between the side wall 61c of the guide 61 and the terminal wall 62e of the stopper 62 is smaller than an interval T1 between the substrate 12 and the first plate 54 of the duct cover 50 but larger than an interval T2 between the substrate 12 and the second plate 55 of the duct cover 50.

Among two guide rails 60 which are positioned adjacent to each other in the thickness direction T of the server module 43, a distance S2 between the upper end of the side wall 60b of one guide rail 60 and the terminal wall 62e of the stopper 62 attached to another guide rail 60 is smaller than the interval T1 between the substrate 12 and the first plate 54.

Among two guide rails 60 which are positioned adjacent to each other in the thickness direction T of the server module 43, a distance S3 between the side wall 61b of one guide rail 60 and the side wall 61c of another guide rail 60 is smaller than an interval T3 between the first and second plates 54 and 55 of the duct cover 50.

As shown in FIG. 5, when the server module 43 is installed in the server-module storage block 41b or the reserve storage block 41d, the lateral sides 14s of the substrate 12 (which is opposite to each other in the width direction W) are inserted into the guides 61 of the guide rails 60 which are attached to the interior walls 41s of the partition members 41a. This makes it possible for an operator to insert the server module 43 into the storage block 41b or 41d in the insertion direction A while the lateral sides 14s of the substrate 12 are guided by the guides 61 of the guide rails 60, and therefore the connecting parts 18a, 18b of the substrate 12 are connected to the connectors 47. At this time, the duct cover 50 covering the substrate 12 is correspondingly moved down as the lateral side 14s of the substrate 12 is being guided by the guide 61 of the guide rail 60 as shown in FIG. 7. For the sake of explanation, three guide rails 60 adjoining together in the thickness direction T will be referred to as a right guide rail 60, a proper guide rail 60, and a left guide rail 60 which are adjacently aligned from the right to the left in FIG. 7. As the lateral side 14s of the substrate 12 is being guided by the guide 61 of the proper guide rail 60, the first plate 54 of the duct cover 50 is moved through a gap between the stopper 62 of the proper guide rail 60 and the right guide rail 60 while the second plate 55 of the duct cover 50 is moved through a gap between the side wall 61b of the proper guide rail 60 and the stopper 62 of the left guide rail 60.

Figure 8:
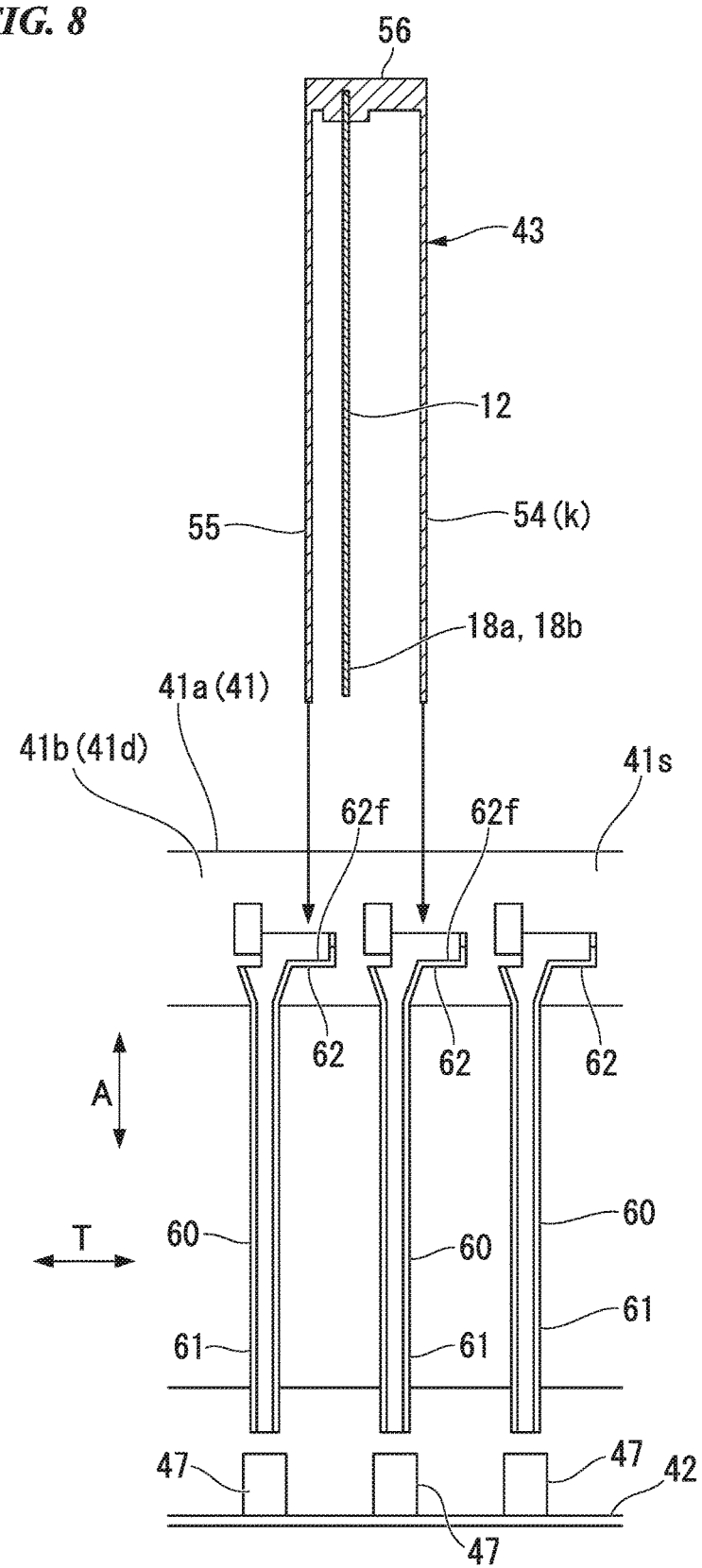
FIG. 8 is a cross-sectional view showing the server module being inserted into the server-module storage block at an irregular position.
Figure 9:
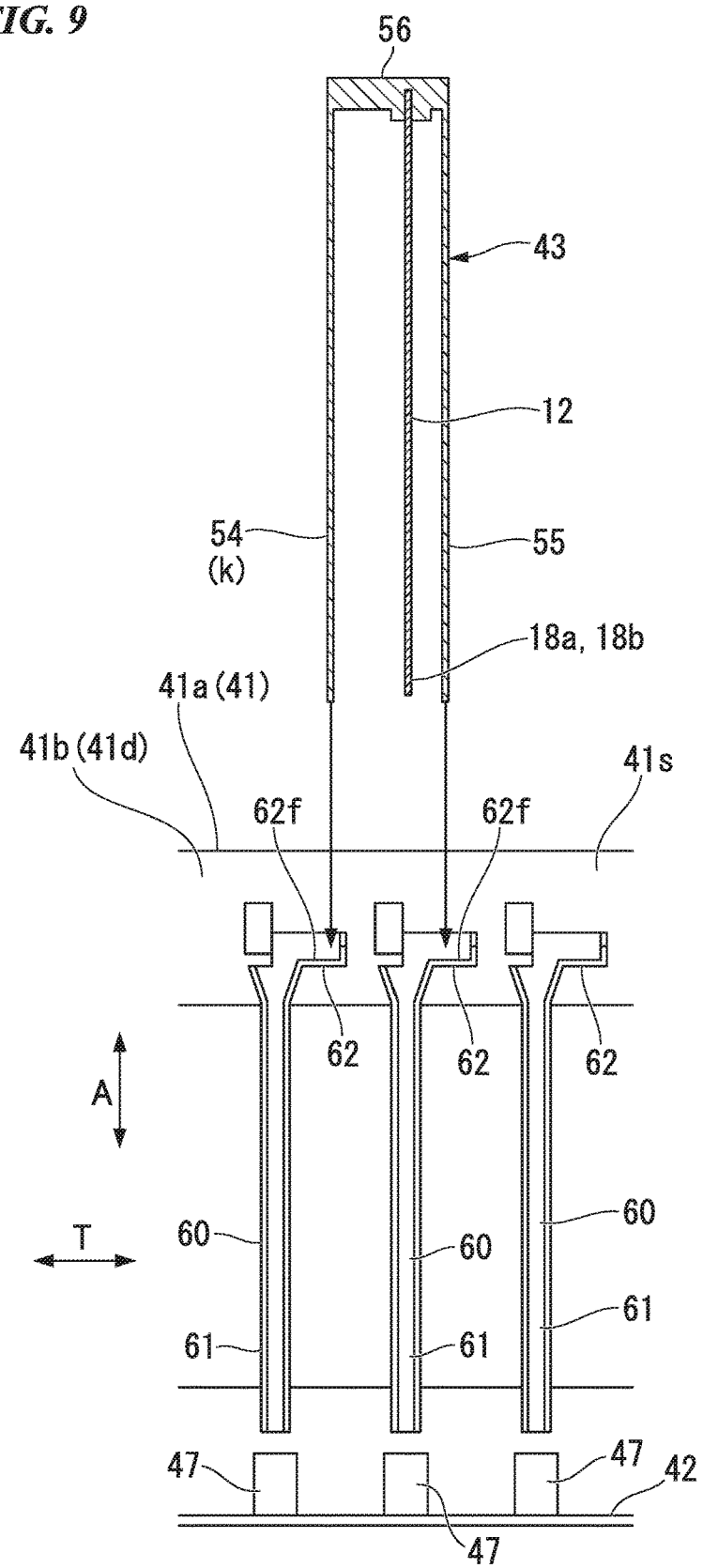
FIG. 9 is a cross-sectional view showing the server module being inserted into the server-module storage block in a reverse manner.
Figure 10:
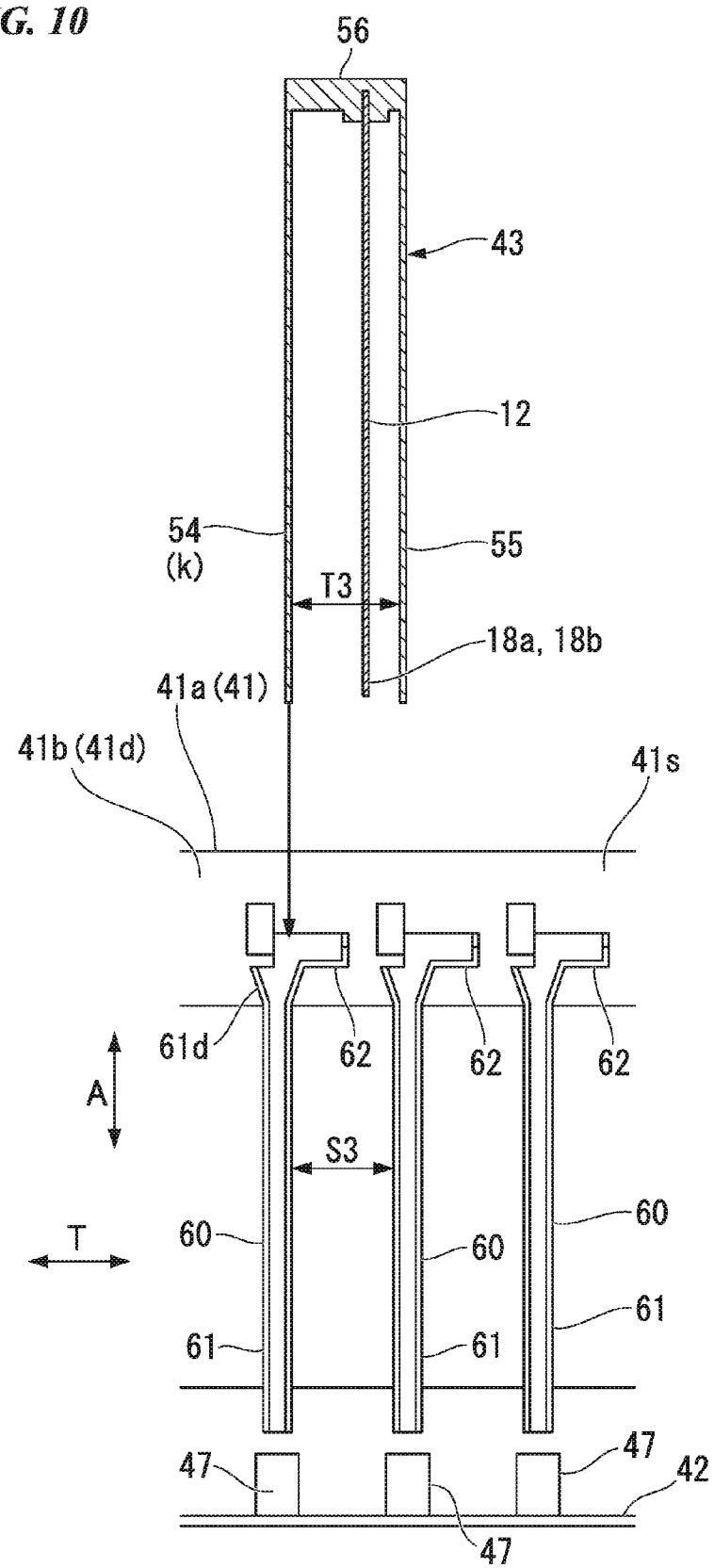
FIG. 10 is a cross-sectional view showing the server module being inserted into the server-module storage block at an irregular position in a reverse manner.

FIG. 8 is a cross-sectional view showing the server module 43 being inserted into the server-module storage block 41b at an irregular position. FIG. 9 is a cross-sectional view showing the server module 43 being inserted into the server-module storage block 41b in a reverse manner. FIG. 10 is a cross-sectional view showing the server module 43 being inserted into the server-module storage block 41b at an irregular position and in a reverse manner. For the sake of explanation, three guide rails 60 adjoining together in the thickness direction T will be referred to as a right guide rail 60, a proper guide rail 60, and a left guide rail 60 which are adjacently aligned from the right to the left in FIGS. 8, 9, 10.

FIG. 8 shows that the server module 43 is irregularly positioned and inserted into the server-module storage block 41b such that the substrate 12 is not properly inserted into the guide 61 of the guide rail 60 but moved downwardly at a deviated position slightly shifted leftwards from the proper position in the thickness direction T. In this case, the first plate 54 of the duct cover 50 is brought into contact with the stopper face 62f of the stopper 62 of the proper guide rail 60 while the second plate 55 of the duct cover 50 is brought into contact with the stopper face 62f of the stopper 62 of the left guide rail 60. Thus, it is possible to reliably prevent the server module 43 from being erroneously inserted into the server-module storage block 41b at an irregular position.

FIG. 9 shows that the server module 43 is reversely turned around and inserted into the server-module storage block 41b such that the substrate 12 is reversely turned around and inserted into the guide 61 of the guide rail 60. In this case, the first plate 54 of the duct cover 50 is brought into contact with the stopper 62 of the left guide rail 60 while the second plate 55 of the duct cover 50 is brought into contact with the stopper 62 of the proper guide rail 60. Thus, it is possible to reliably prevent the server module 43 reversely turned around from being erroneously inserted into the server-module storage block 41b.

FIG. 10 shows that the server module 43 is reversely turned around, irregularly positioned, and inserted into the server-module storage block 41b such that the substrate 12 reversely turned around is moved downwardly at a deviated position, shifted leftwards from the proper position in the thickness direction T, and not properly inserted into the guide 61 of the guide rail 60. In this case, the first plate 54 of the duct cover 50 is brought into contact with the stopper 62 or the taper portion 61d of the left guide rail 60 while the second plate 55 of the duct cover 50 is brought into contact with the taper portion 61d of the proper guide rail 60. This is because the distance S3 between the side wall 61b of one guide rail 60 and the side wall 61c of another guide rail 60 among two guide rails adjoining together is smaller than the interval T3 between the first plate 54 and the second plate 55 in the duct cover 50. Thus, it is possible to reliably prevent the server module 43 reversely turned around and located at a deviated position (laterally shifted from the proper position) from being erroneously inserted into the server-module storage block 41b.

In the duct cover 50, the first and second plates 54 and 55 are separated from each other in the thickness direction T so as to sandwich the substrate 12 in an asymmetrical manner such that the substrate is located closer to the second plate 55 rather than the first plate 54. In this structure, at least one of the first and second plates 54 and 55 serves as an interference member k which interferes with the stopper 62 only when the substrate 12 is inserted into the server-module storage block 41b having the connectors 47 at an irregular position or in an irregular manner.

Briefly speaking, the server 40 includes the chassis 41, the stopper(s) 62, and the interference member(s) k. The stopper 62 is arranged in the chassis 41 at the predetermined position which slightly deviates from the substrate 12 in the thickness direction perpendicular to the insertion direction A in which the substrate 12 is inserted into the connectors 47. The interference member k is arranged on the front face 12b of the substrate 12 and disposed asymmetrical to the second plate 55 of the duct cover 50 (which is arranged on the rear face 12c of the substrate 12) with respect to the substrate 12. Additionally, the interference member k interferes with the stopper 62 only when the substrate 12 is inserted into the connector 47 at an irregular position or in a reverse manner.

Thus, it is possible to prevent the interference member k from interfering with the stopper 62 since the first plate 54 of the duct cover 50 is positioned on the opposite side of the stopper 62 with respect to the substrate 12 when the server module 43 including the substrate 12 is inserted into the connectors 47 in a proper manner. Additionally, it is possible to reliably prevent the substrate 12 from being inserted into the connectors 47 at an irregular position or in a reverse manner since the first plate 54 of the duct cover 50 interferes with the stopper 62.

According to the above structure, the interference member k corresponding to the first and second plates 54 and 55 of the duct cover 50 is disposed in proximity to the lateral side 14s of the substrate 12 in its width direction W while the stopper 62 is disposed on the interior face 41s of the partition member 41a which is positioned to face the lateral side 14s of the substrate 12. That is, the arrangement of the interference member k and the stopper 62 may not obstruct the layout of the connectors 47 in the chassis 41. As a result, it is possible to improve the freedom of designing the layout of the connectors 47 while reliably preventing erroneous insertion of the server module 43 including the substrate 12.

Additionally, the guide rail 60 configured to guide the substrate 12 in the insertion direction A into the connectors 47 is attached to the chassis 41 while the stopper 62 is disposed at an offset position slightly deviated from the guide rail 60 in one side of the thickness direction T of the substrate 12. This makes it possible to reliably guide the substrate 12 in the insertion direction A by means of the guide rail(s) 60. Thus, it is possible for the interference member k to reliably interfere with the stopper 62 when the substrate 12 is inserted into the connectors 47 at an irregular position or in a reverse manner.

A plurality of guide rails 60 are linearly laid with predetermined intervals in the thickness direction T of the substrate 12 while the stoppers 62 are each interposed between the guide rails 60 which adjoin together in the thickness direction T of the substrate 12. Thus, it is possible to reliably prevent the substrate 12 from being erroneously inserted between the guide rails 60 by means of the stopper(s) 62 disposed between the guide rails 60.

Moreover, the stopper 62 is disposed on the front side in the insertion direction A of the substrate 12 with respect to the guide rail 60. This makes it possible to reliably prevent the erroneous insertion of the substrate 12 in an early stage prior to the insertion of the substrate 12 into the guide rails 60. Thus, it is possible to prevent the substrate 12 or electronic parts mounted on the substrate 12 from interfering with the connectors 47, and therefore it is possible to prevent any damages occurring on the substrate 12, the connectors 47, and so on.

As described above, the first plate 54 of the duct cover 50 is arranged to cover the front face 12b of the substrate 12 in its thickness direction T. The first plate 54 serving as the interference member k interferes with the stopper 62 when the substrate 12 is inserted into the connectors 47 at an irregular position or in a reverse manner. That is, the present embodiment can use the first plate 54 serving as the interference member k. This eliminates the necessity of additionally providing the interference member k on the substrate 12. The first plate 54 may interfere with the stopper 62 in case of erroneous insertion of the substrate 12 into the connectors 47. Thus, it is possible to prevent the substrate 12 or electronic parts mounted on the substrate 12 from interfering with the stopper(s) 62, and therefore it is possible to prevent any damages occurring on the substrate 12 or the like.

Additionally, the second plate 55 of the duct cover 50 is arranged to cover the rear face 12c of the substrate 12 in its thickness direction T, wherein the substrate 12 sandwiched between the first and second plates 54 and 55 is disposed at an offset position closer to the second plate 55 rather than the first plate 54. Compared to the second plate 55, the first plate 54 is further deviated from the substrate 12 in the thickness direction T. The present embodiment can use the first plat 54 serving as the interference member k. This eliminates the necessity of additionally providing the interference member k.

Moreover, the first and second plates 54 and 55 are interconnected using the third plate 56 which is arranged close to the rear side 14b of the substrate 12 in the other side of the insertion direction A. The duct cover 50 including the first plate 54, the second plate 55, and the third plate 56 is able to guide cooling air, caused by the fan modules 44, to flow on the surface/backside of the substrate 12. That is, the present embodiment shares the function of the interference member k and the function of the duct cover 50 with a single member; hence, it is possible to reduce the number of parts and thereby reduce manufacturing costs.

As described above, the server module 43 includes the substrate 12 and the duct cover 50, wherein the duct cover 50 further includes the first plate 54 configured to cover the front side 12b of the substrate 12 and the second plate 55 configured to cover the rear face 12c of the substrate 12. Herein, the substrate 12 is disposed at an offset position, closer to either the first plate 54 or the second plate 55, rather than the center position between the first and second plates 54 and 55. In this structure, the first plate 54 is positioned farther from the substrate 12 than the second plate 55. This assures that the first plate 54 (which is disposed asymmetrically with the second plate 55 with respect to the substrate 12) can implement the function of the interference member k which interferes with the stopper 62 only when the substrate 12 is inserted into the connectors 47 at an irregular position or in a reverse manner. Thus, it is possible to reliably prevent erroneous insertion of the server module 43 into the connectors 47.

Briefly speaking, the chassis 41 includes the connectors 47 and the stoppers 62. The connectors 47 are arranged to receive the connecting parts 18 of the substrate 12 being inserted into the storage block 41b or 41d in the predetermined direction. The stoppers 62 are each disposed at a position slightly departing from the substrate 12 in its thickness direction T; hence, the stopper 62 may interfere with the substrate 12 being inserted into the connectors 47 at an irregular position or in a reverse manner, thus reliably preventing erroneous insertion of the substrate 12 into the connectors 47. The stopper 62 is attached to the interior face 41s of the partition member 41a at the predetermined position to face at least one lateral side 14s of the substrate 12 in its width direction W perpendicular to the insertion direction A and the thickness direction T of the substrate 12. According to the above structure of the chassis 41, it is possible to reliably prevent erroneous insertion of the substrate 12 or the server module 43 equipped with the interference member k.

The stoppers 62 may not obstruct the layout of the connectors 47 in the chassis 41 since the stoppers 62 are each disposed at the predetermined position to face the lateral side 14s of the substrate 12 in its width direction W. Thus, it is possible to improve the freedom of designing the layout of the connectors 47 while reliably preventing erroneous insertion of the server module 43 including the substrate 12.

In this connection, the present embodiment provides the server module 43 with the first and second plates 54 and 55. For the sake of prevention of erroneous insertion, it is possible for the server module 43 to provide at least the first plate 54. The first and second plates 54 and 55 each possibly serving as the interference member k form part of the duct cover 50; but it is possible to provide the interference member k independently of the duct cover 50, wherein the interference member k can be directly attached to the substrate 12.

Additionally, the server module 43 may employ any configuration or structure. Therefore, it is possible to appropriately change the number of server modules 43 incorporated into the server 40 and the arrangement of the server modules 43 in the server 40. In this connection, it is possible to incorporate the server modules 43 into any devices other than the server 40. The present embodiment refers to the server module 43 as an example of an electronic-component unit. However, the aforementioned structures of the present embodiment can be applied to any electronic-component units other than the server module 43.

Lastly, the present invention is not necessarily limited to the foregoing embodiments and variations; hence, the present invention may embrace any design changes or modifications within the scope of the invention as defined by the appended claims.

What is claimed is:

1. An information processing device comprising:
  an electronic component using a substrate;
  a casing having a plurality of connectors connectible with the electronic component in an insertion direction;
  a stopper disposed at a first position of the casing separated from the electronic component in its thickness direction perpendicular to the insertion direction of the electronic component when connected to the plurality of connectors;

an interference member disposed at a second position of the electronic component in its thickness direction, wherein the second position is adjusted relative to the first position in advance such that the interference member interferes with the stopper only when the electronic component is inserted into the plurality of connectors at an irregular position or in a reverse manner; and a plurality of guide members configured to guide the electronic component towards the plurality of connectors in the insertion direction in the casing, wherein the interference member is disposed close to at least one end of the electronic component in its width direction perpendicular to the insertion direction and the thickness direction of the electronic component, and wherein the stopper is attached to the casing at the predetermined position which is opposite to the at least one end of the electronic component for positioning the interference member.

2. An information processing device, comprising:

an electronic component using a substrate with a plurality of connecting parts;

a casing having a plurality of connectors connectible with plurality of connecting parts of the electronic component in an insertion direction;

a plurality of guide members configured to guide the electronic component towards the plurality of connectors in the insertion direction in the casing, wherein the plurality of guide members are aligned in different rows with predetermined intervals in the thickness direction of the electronic component;

a cover member configured to cover the electronic component with a first plate and a second plate, forming openings at opposite sides for introducing a cooling are circulated in the casing;

a stopper disposed at a first position of the casing in proximate to the plurality of guide members; and an interference member disposed at a second position of the electronic component covered by the cover member, wherein the second position is adjusted relative to the first position in advance such that the interference member interferes with the stopper only when the electronic component is inserted into the plurality of connectors at an irregular position or in a reverse manner, wherein the plurality of guide members are aligned in different rows with predetermined intervals in the thickness direction of the electronic component, wherein the stopper is positioned with an offset to each of the plurality of guide members to be engaged with the electronic component, and wherein the interference member is disposed close to at least one end of the electronic component in its width direction perpendicular to the insertion direction and the thickness direction of the electronic component.

3. The information processing device according to claim 2, wherein the first plate and the second plate are interconnected together at a reverse side of the electronic component in a counter direction opposite to the insertion direction.

4. An electronic-component unit comprising:

an electronic component using a substrate with a plurality of connecting parts connectible a plurality of connectors formed in a casing when guided along a plurality of guide members; and a duct cover including a first plate configured to cover a first face of the substrate and a second plate configured to cover the second face of the substrate, forming openings at opposite sides for introducing a cooling are circulated in the casing, wherein the substrate is interposed between the first plate and the second plate such that the substrate is disposed with an offset closer to either the first plate or the second plate rather than a center position between the first plate and the second plate, wherein a stopper is disposed at a first position of the casing in proximate to the plurality of guide members while an interface member is disposed at a second position of the electronic component covered by the cover member, and wherein the second position is adjusted relative to the first position in advance such that the interference member interferes with the stopper only when the electronic component is inserted into the plurality of connectors at an irregular position or in a reverse manner.

5. A casing for installing an electronic component using a substrate, comprising:

a plurality of connectors connectible with the electronic component in an insertion direction;

a plurality of guide members configured to guide the electronic component towards the plurality of connectors in the insertion direction; and a stopper disposed at a first position separated from the electronic component in its thickness direction perpendicular to the insertion direction of the electronic component when connected to the plurality of connectors, wherein the stopper interferes with an interface member disposed at a second position of the electronic component, wherein the first position is adjusted relative to the second position so as to prevent the electronic component from being inserted into the plurality of connectors only when the electronic component is inserted into the plurality of connectors at an irregular position or in a reverse manner, and wherein the electronic component is installed in a predetermined portion subjected to a cooling air caused by a cooling fan.

* * * * *